(12) United States Patent
Jagmohan et al.

(10) Patent No.: US 8,428,119 B2
(45) Date of Patent: Apr. 23, 2013

(54) METHOD AND APPARATUS FOR MULTI-HYPOTHESIS DECODER SIDE-INFORMATION CODING

(75) Inventors: Ashish Jagmohan, Irvington, NY (US); Anshul Seghal, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1464 days.

(21) Appl. No.: 11/623,591

(22) Filed: Jan. 16, 2007

(65) Prior Publication Data

US 2008/0189073 A1 Aug. 7, 2008

(51) Int. Cl.
*H04N 7/12* (2006.01)
*H04B 1/66* (2006.01)

(52) U.S. Cl.
USPC ..................................... 375/240.01; 375/240

(58) Field of Classification Search .................. None
See application file for complete search history.

(56) References Cited

U.S. PATENT DOCUMENTS

| | | | | |
|---|---|---|---|---|
| 4,882,733 | A * | 11/1989 | Tanner | 714/752 |
| 5,929,538 | A * | 7/1999 | O'Sullivan et al. | 307/66 |
| 7,266,749 | B1 * | 9/2007 | Zhong et al. | 714/756 |
| 7,414,549 | B1 * | 8/2008 | Yang et al. | 341/50 |
| 2001/0028690 | A1 * | 10/2001 | Ebel, Sr. | 375/340 |
| 2004/0225940 | A1 * | 11/2004 | Kerr et al. | 714/752 |
| 2007/0043543 | A1 * | 2/2007 | Wandzura | 703/2 |
| 2007/0174633 | A1 * | 7/2007 | Draper et al. | 713/186 |
| 2008/0031344 | A1 * | 2/2008 | Lu et al. | 375/240.19 |
| 2010/0092008 | A1 * | 4/2010 | Oh et al. | 381/119 |

OTHER PUBLICATIONS

Markus Fliert, et al., "A Locally Optimal Design Aligorithm for Block-Based Multi-Hypothesis Motion-Compensated Prediction," pp. 1-10, Proceedings of the IEEE DCC, pp. 239-248, Snowbird, Utah, Mar. 1998.
Thomas Wiegand, et al., "Overview of the H.264/AVE Video Coding Standard," pp. 1-19, IEEE Transactions on Circuits and Systems for Video Technology, Jul. 2003.
Karel Rijkse, "H.263: Video Coding for Low Bit-Rate Communication," pp. 42-45, IEEE Communications Magazine—Dec. 1996.

* cited by examiner

*Primary Examiner* — Joseph Ustaris
*Assistant Examiner* — Frederick Bailey
(74) *Attorney, Agent, or Firm* — Daniel P. Morris, Esq.; F. Chau & Associates, LLC

(57) ABSTRACT

A computer-implemented method for decompression in data compression systems with decoder side-information including a plurality of signals each of which is correlated to a source, includes determining a conditional probability function of the source conditioned upon a subset of decoder side-information signals, wherein the decoder side-information signals include pre-stored and received statistical information, estimating an a-posteriori probability function based on the conditional probability function and extrinsic information, evaluating a stopping criterion for decompression, generating the extrinsic information based on the a-posteriori probability function, and determining a likelihood threshold for determining a most probable value of a quantized source signal based on the a-posteriori probability function and outputting the quantized source upon determining to stop decompression.

19 Claims, 5 Drawing Sheets

METHOD AND APPARATUS FOR MULTI-HYPOTHESIS DECODER SIDE-INFORMATION CODING

BACKGROUND OF THE INVENTION

1. Technical Field

The present invention relates to decompression in data compression systems with decoder side-information. More specifically, the present invention relates to decompression in data compression systems in which the decoder side-information includes a plurality of signals each of which is correlated to the source which is to be decompressed.

2. Description of Related Art

Data compression and decompression with decoder side-information is of practical interest in several applications. These include, but are not limited to, low complexity media coding, scalable and error-resilient data transmission, transmission of media and text over distributed and peer-to-peer networks, compression of sensor network data video, storage of biometric data etc. Data compression systems which utilize decoder side-information are commonly termed Wyner-Ziv coding systems. A typical Wyner-Ziv system includes an encoder which compresses a source signal, and a decoder which decodes the source signal with the help of one or more correlated signals, termed the decoder side-information. The case where more than one correlated signal is present at the decoder as side-information is termed the multi-hypothesis decoder side-information coding case.

FIG. 1 depicts a Wyner-Ziv coding system. The system includes an encoder 100 and a decoder 111. The input to the encoder is the source signal X 101, which is to be compressed and communicated to the decoder. The source signal 101 is passed through a lossy source coder 102 which, typically, converts the input signal into a quantized signal 104 whose samples take values from a discrete set of integers. As an example, in the case of a video Wyner-Ziv encoder, the source to be compressed is the current video frame, and the lossy source coder 102 first transforms the data using a discrete cosine transform, and uses a uniform scalar quantizer with a deadzone to convert the transform coefficients into integers. The quantized signal 104 passes through a Slepian-Wolf coder 103. The Slepian-Wolf coder 103 processes the quantized signal and generates a syndrome or parity bitstream 105 which is communicated to the decoder. As an example, the Slepian-Wolf coder 103 may include a good channel coder. The quantized signal 104 is multiplied by the parity-check matrix of the channel code to generate the syndrome bitstream 105. As another example a systematic channel code may be used in the Slepian-Wolf coder 103. The quantized signal 104 is multiplied by the generator matrix of the channel code, and the parity bits generated constitute the party bitstream 105. Typically, the syndrome or parity bitstream includes a plurality of indices drawn from the set of integers or a Galois field.

The inputs to the Wyner-Ziv decoder 110 are the syndrome/parity bitstream 105, and the decoder side-information signals Y, ..., $Y_J$ 113. The Slepian-Wolf decoder 111 processes the syndrome/parity bitstream 105 and the decoder side-information 113 to reconstruct the quantized source signal 114. As an example, in the case of video Wyner-Ziv decoding, the side-information signal may include a previously reconstructed video frame, and the Slepian-Wolf decoder treats the side-information as a corrupted version of the source video frame and may use a soft channel decoding algorithm to correct the side-information. The quantized source signal 114 is passed through the source reconstruction means 112 which converts it into a reconstructed source signal $X_r$ 115 which lies in the same domain as the source signal 101. The source reconstruction may utilize the side-information 113. As an example, in the case of video Wyner-Ziv decoding, the source reconstruction means using an inverse quantizer whose reconstruction points may depend on the side-information 113, and using an inverse discrete cosine transform to reconstruct the source video frame.

When the quantized source signal 114 at the decoder does not match the quantized source signal 104 at the encoder, the Slepian-Wolf decoding is deemed to have failed, and the result is a distorted source reconstruction 115. To avoid Slepian-Wolf coding failure, the rate of the syndrome/parity bitstream 105 (i.e. the number of syndrome or parity symbols) needs to be sufficiently high. However, having a high rate of the syndrome/parity bitstream 105 conflicts with the goal of compression, which is to transmit as low rate a bitstream as possible from encoder to decoder. In general the better the Slepian-Wolf decoder the lower is the rate of the syndrome/parity bitstream needed for decoding without failure, and thus the greater is the achieved compression.

FIG. 2 shows the detailed working of a conventional Slepian Wolf decoding means in the case where the decoder side-information includes two signals $Y_1$ and $Y_2$. As an example, in the case of a video Wyner-Ziv decoder, the decoder side-information may includes two previously reconstructed video frames. The inputs to the Slepian-Wolf decoder 200 are the syndrome/parity bitstream 201 received from the Wyner-Ziv encoder, and the side-information signals $Y_1$ 207 and $Y_2$ 208. The side-information signals are combined using a fixed linear combination 205 and the linearly combined signal is passed to the probability estimation means 206. The probability estimation means 206 computes the conditional probability $P(X|Y_1,Y_2)$ 209 of the source signal, conditioned on the computed linear combination. The syndrome/parity bitstream 201 and the conditional probability distribution 209 are both input to the soft channel decoder 202. The output of the soft channel decoder is an a-posteriori probability distribution Q(X) 203 of the quantized source signal. The a-posteriori probability distribution Q(X) 203 is passed through a likelihood threshold means 204 which computes the most probable value of the quantized source signal based on Q(X). The computed most probable source signal value is output as the quantized source signal 210.

One limitation of the Slepian-Wolf decoding method described above is that it is inefficient in terms of the syndrome/parity bitstream rate needed for Slepian-Wolf coding to occur without failure. This is because the soft channel coding requires the probability estimate $P(X|Y_1, \ldots, Y_J)$ for best compression efficiency, i.e. for correct decoding with the minimum possible syndrome/parity bitstream rate. However computing $P(X|Y_1, \ldots, Y_J)$ is, typically, infeasible since it includes computation of the high-dimensional probability function $P(X,Y_1, \ldots, Y_J)$, and that would need more samples than are typically available at the decoder. Consequently the conventional Slepian-Wolf decoding method described above uses the probability function $P(X|a_1Y_1 + \ldots + a_JY_J)$ where $a_1 + \ldots + a_J=1$ as an approximation to $P(X|Y_1, \ldots, Y_J)$, as shown in FIG. 2 for the case where J=2. This approximation, however, is often not very good and thus the Slepian-Wolf decoder needs high syndrome/parity bitstream rate for correct decoding. This results in poor compression performance.

Therefore, a need exists for an improved method for Slepian-Wolf decoding needing a small syndrome/parity bitstream rate to provide Slepian-Wolf decoding without failure.

SUMMARY OF THE INVENTION

According to an embodiment of the present disclosure, a computer-implemented method for decompression in data compression systems with decoder side-information including a plurality of signals each of which is correlated to a source, includes determining a conditional probability function of the source conditioned upon a subset of decoder side-information signals, wherein the decoder side-information signals include pre-stored and received statistical information, estimating an a-posteriori probability function based on the conditional probability function and extrinsic information, evaluating a stopping criterion for decompression, generating the extrinsic information based on the a-posteriori probability function, and determining a likelihood threshold for determining a most probable value of a quantized source signal based on the a-posteriori probability function and outputting the quantized source upon determining to stop decompression.

According to an embodiment of the present disclosure, a computer readable medium is provided embodying instructions executable by a processor to perform a method for decompression in data compression systems with decoder side-information including a plurality of signals each of which is correlated to a source. The method comprises determining a conditional probability function of the source conditioned upon a subset of decoder side-information signals, wherein the decoder side-information signals include pre-stored and received statistical information, estimating a plurality of a-posteriori probability functions based on the conditional probability function and extrinsic information, evaluating a stopping criterion for decompression, generating the extrinsic information based on the a-posteriori probability function, and determining a likelihood threshold for determining a most probable value of a quantized source signal based on the a-posteriori probability function and outputting the quantized source upon determining to stop decompression.

BRIEF DESCRIPTION OF THE FIGURES

Preferred embodiments of the present disclosure will be described below in more detail, with reference to the accompanying drawings.

DETAILED DESCRIPTION OF PREFERRED EMBODIMENTS

Embodiments of the present invention disclosure herein are intended to be illustrative only, since numerous modifications and variations therein will be apparent to those of ordinary skill in the art. In reference to the drawings, like numbers will indicate like parts continuously throughout the views.

Figure 1:
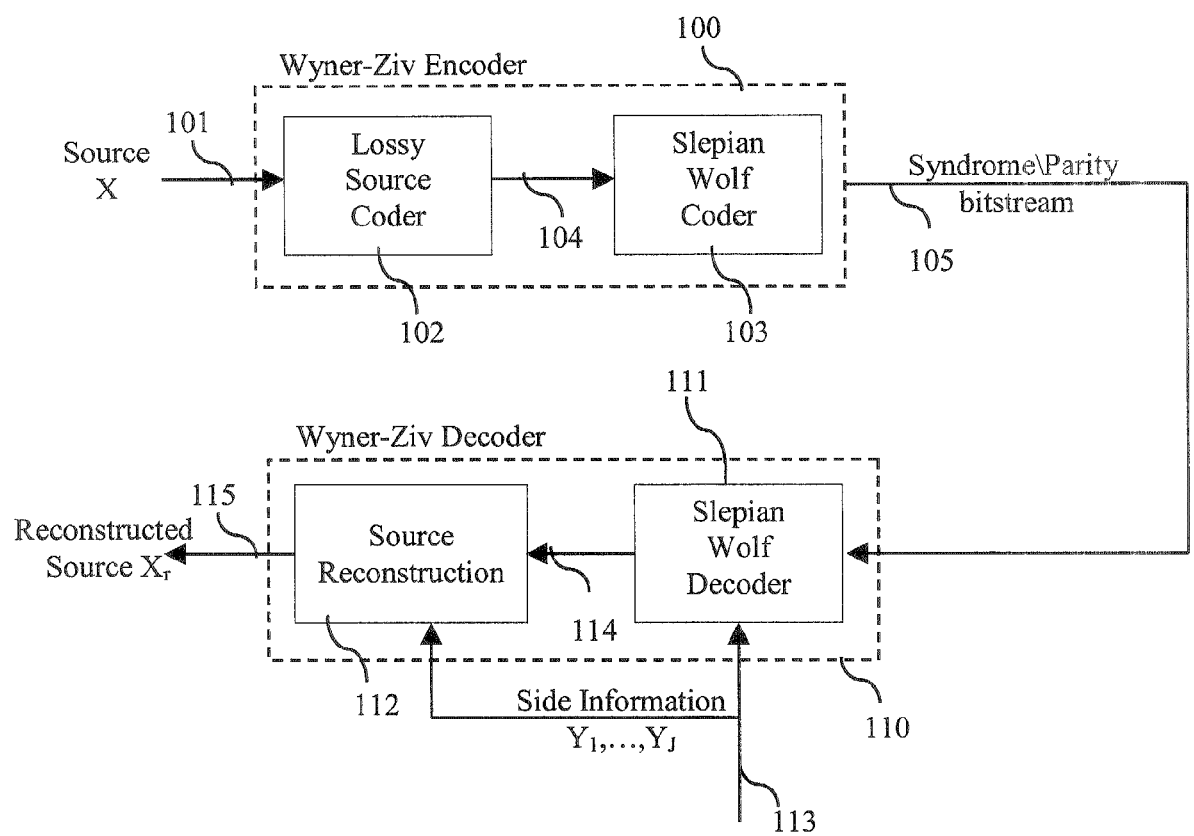
FIG. 1 is a diagram illustrating a prior-art Wyner-Ziv coding system illustrating the operation of the Wyner-Ziv encoder and Wyner-Ziv decoder.
Figure 2:
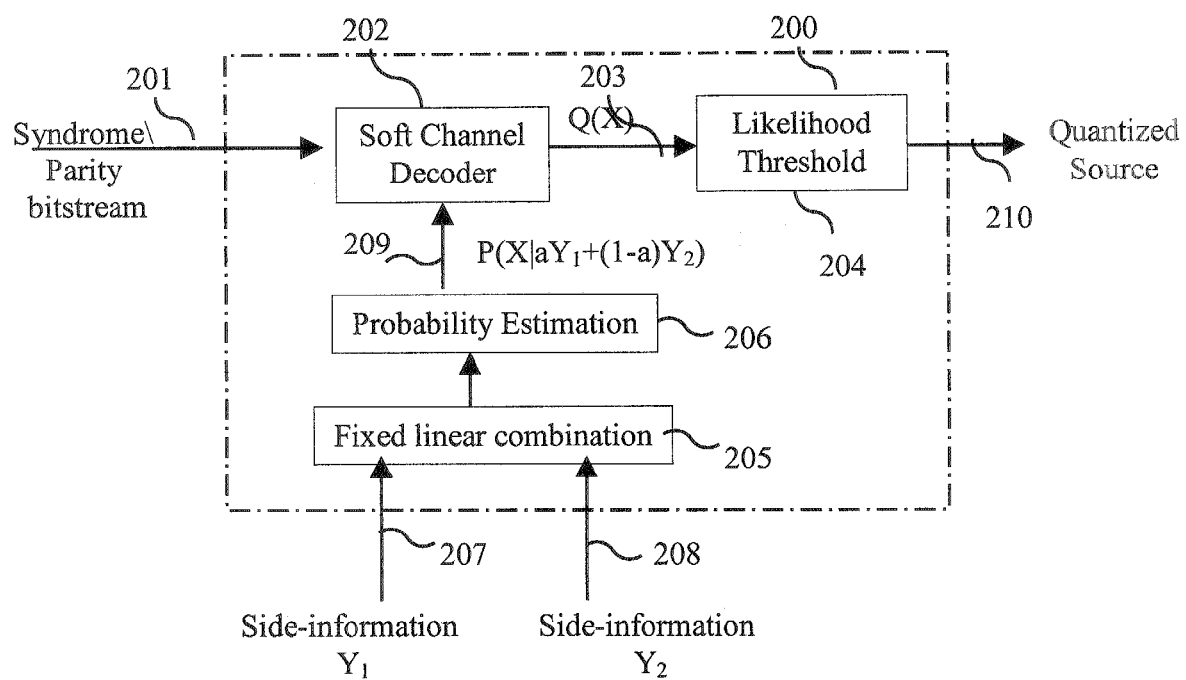
FIG. 2 is a diagram illustrating a prior-art Slepian-Wolf decoder.
Figure 3:
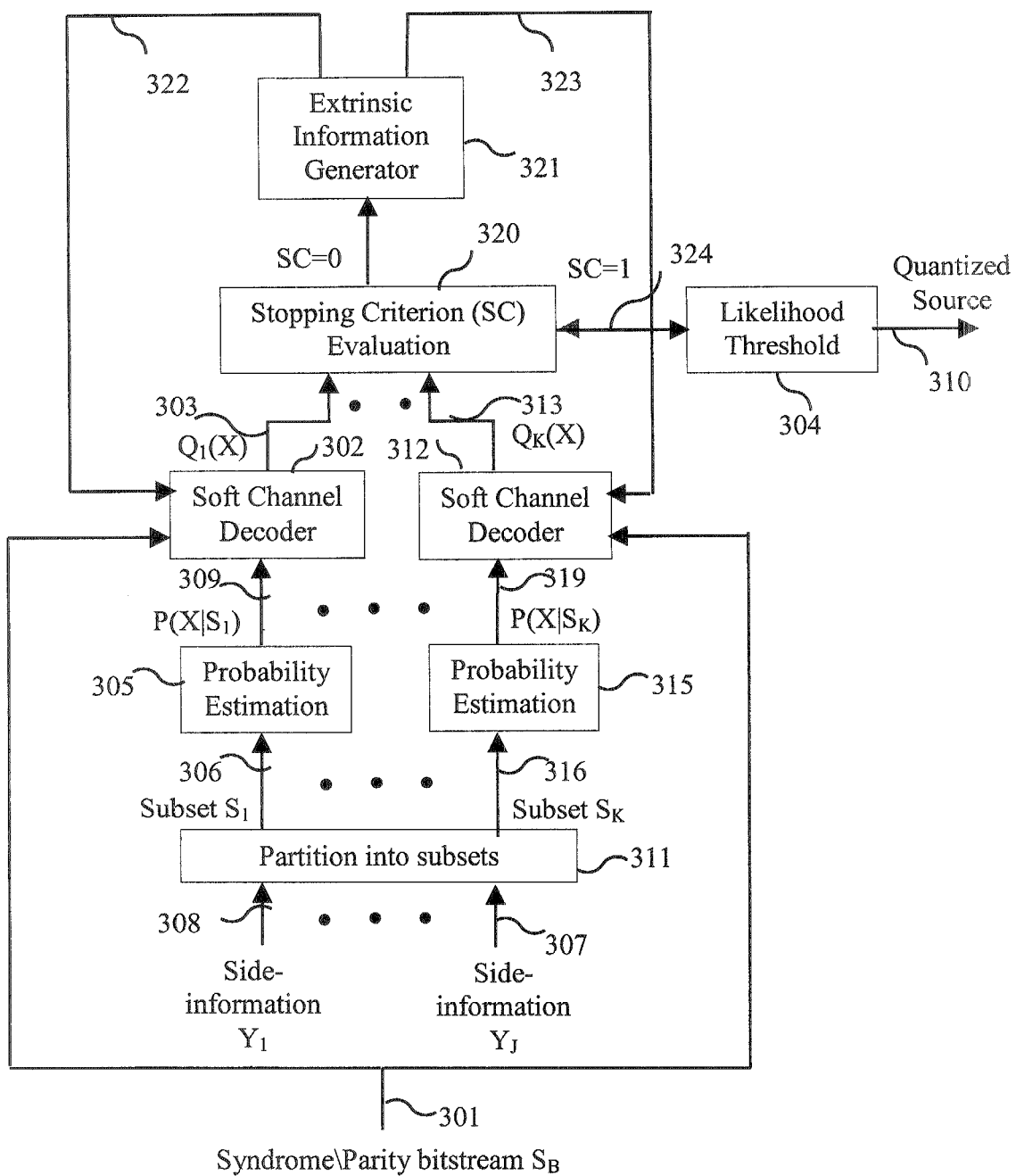
FIG. 3 is a diagram illustrating an embodiment of a Slepian-Wolf decoder according to an embodiment of the present invention.

Referring to FIG. 3, an exemplary embodiment of the present invention a system for multi-hypothesis Slepian-Wolf decoding within a Wyner-Ziv decoder receives inputs comprising a syndrome/parity bitstream 301 received from a Wyner-Ziv encoder, and side-information signals $Y_1, \ldots, Y_J$ (307, 308). The syndrome/parity bitstream 301 includes a plurality of indices drawn from the set of integers or a Galois field. The set of side-information signals is partitioned into K subsets by a partitioner 311. Each of the K subsets is passed through a probability estimator, which may include first and second probability estimators 305 and 315, respectively. The subset $S_1$ 306 is passed through the first probability estimator 305, which computes the probability function $P(X|S_1)$ 309. The subset $S_K$ 316 is passed through the second probability estimator 315, which computes the probability function $P(X|S_1)$ 319. In addition to a side-information subset, the probability estimator 305/315 may utilize a-priori correlation model information stored in a look-up table at the decoder, as well as model information transmitted separately from the syndrome/parity bitstream 301 by the Wyner-Ziv encoder. This model information may include, but is not limited to, the instantaneous and long-term mean-squared energy of the source signal.

Each of the K probability functions is passed through a soft channel decoder including first and second soft channel decoders 302 and 312, respectively. Probability function $P(X|S_1)$ 309 is passed through the first soft channel decoder 302. The first soft channel decoder 302 makes use of the syndrome/parity bitstream $S_B$ 301, the probability function 309, the extrinsic information 322 and a pre-stored codebook C used by the Wyner-Ziv encoder, to estimate the a-posteriori probability function $Q_1(X)=P(X|Y_1, \ldots, Y_J, S_B, C)$ 303. In an exemplary embodiment the codebook C is that of a linear block code, and the first soft channel decoder 302 uses maximum a-posteriori decoding to compute the function $Q_1(X)$ 303. In another embodiment the codebook C is that of a low-density parity-check code and the channel decoder 302 uses graph decoding wherein the graph is a function of the codebook C, and graph node probabilities are computed as a function of $S_B$ 301, the probability function 309 and the extrinsic information 322. In another embodiment graph decoding is performed using the belief propagation algorithm. Similarly, probability function $P(X|S_K)$ 319 is passed through the second soft channel decoder 312. The second soft channel 312 makes use of the syndrome/parity bitstream $S_B$ 301, the probability function 319, the extrinsic information 323 and the pre-stored codebook C used by the Wyner-Ziv encoder, to estimate the a-posteriori probability function $Q_K(X)=P(X|Y_1, \ldots, Y_J, S_B, C)$ 313.

The computed a-posteriori probability functions $Q_1(X), \ldots, Q_K(X)$ are passed through a stopping criterion (SC) evaluator 320. The stopping criterion evaluation means 320 may use data including, but not limited to, the a-posteriori probability functions, and statistical information (e.g., the mean and variance of the marginal distribution of the source, transmitted by the encoder to the decoder) from the Wyner-Ziv encoder, to determine whether the Slepian-Wolf decoding is to be terminated. In an exemplary embodiment, the stopping criterion evaluator 320 computes the maximum integrated square error between the K a-posteriori functions $Q_1(X), \ldots, Q_K(X)$ to make this determination, for example, the stopping criterion evaluation means 320 implements the following computation $$SC = (\max_{i,j \in \{1, \ldots, K\}} \int (Q_i(X) - Q_j(X))^2 dX < \theta)$$

for a pre-determined constant θ. In another exemplary embodiment, the stopping criterion evaluator 320 makes additional use of the marginal probability distribution f(X) of the source, received from the Wyner-Ziv encoder, and implements the following computation to determine the stopping criterion $$SC = (\max\{\max_{i \in \{1,\ldots,K\}} \int (Q_i(X) - f(X))^2 dX, \max_{i,j \in \{1,\ldots,K\}} \int (Q_i(X) - Q_j(X))^2 dX\} < \theta)$$

If the stopping criterion evaluator 320 determines that SC=1, it computes the true a-posteriori probability function as a function of the a-posteriori probability functions $Q_1(X), \ldots, Q_K(X)$ and statistical information from the encoder. In an exemplary embodiment, the true a-posteriori function Q(X) is computed as $$Q(X) = \frac{1}{K+1}\left\{f(X) + \sum_{i \in \{1,\ldots,K\}} Q_i(X)\right\}$$

In an additional exemplary embodiment the true a-posteriori function is computed by taking the mean of the subset of a-posteriori functions $Q_i(X)$ which have mean square integrated error with respect to f(X) less than a fixed threshold. In an additional exemplary embodiment the true a-posteriori function is computed as $$Q(X) = \lambda_0 f(X) + \sum_{i \in \{1,\ldots,K\}} \lambda_i Q_i(X)$$

where $\lambda_i$ are weights which may be fixed or determined on the basis of f(X) and $Q_i(X)$. The computed function Q(X) 324 is passed through a likelihood-threshold means 304 which computes the most probable value of the quantized source signal based on Q(X). The computed most probable source signal value is output as the quantized source signal 310.

If the stopping criterion evaluator 320 determines that SC=0, it passes the a-posteriori functions $Q_1(X), \ldots, Q_K(X)$ to an extrinsic information generator 321. The extrinsic information generator means 321 computes extrinsic information functions $E_1(X), \ldots, E_K(X)$ to send to the soft channel decoders 302/312. The extrinsic information function $E_1(X)$ 322 is computed by the use of data including, but not limited to the a-posteriori functions $Q_1(X), \ldots, Q_K(X)$ and the source statistics received from the Wyner-Ziv encoder including the marginal probability distribution f(X) of the source. The exemplary embodiment the extrinsic information generator 321 implements the following computation to generate the extrinsic information $E_1(X)$ 322:

$$E_1(X) = \lambda_0 f(X) + \sum_{i \in \{1,\ldots,K\}, i \neq 1} \lambda_i Q_i(X)$$

The additional exemplary embodiment the extrinsic information generator 321 implements the following computation to generate the extrinsic information $E_1(X)$ 322:

$$E_1(X) = \frac{1}{\int \prod_{i \in \{1,\ldots,K\}, i \neq 1} Q_i(X) dX} \prod_{i \in \{1,\ldots,K\}, i \neq 1} Q_i(X)$$

The generated extrinsic information function $E_1(X)$ 322 is sent to the first soft channel decoder 302 for use in the next decoding iteration. Similarly, the extrinsic information function $E_K(X)$ 323 is computed by the use of data including, but not limited to the a-posteriori functions $Q_1(X), \ldots, Q_K(X)$ and the source statistics received from the Wyner-Ziv encoder including the marginal probability distribution f(X) of the source. The generated extrinsic information function $E_K(X)$ 323 is sent to the second soft channel decoder 312 for use in the next decoding iteration.

The use of multiple soft channel decoders within an iterative method increases the efficacy of Slepian-Wolf decoding. This is reflected in the lower rate of the syndrome/parity bitstream $S_B$ needed to achieve Slepian-Wolf decoding without failure. Thus the presented method allows for greater compression to be achieved.

Figure 4:
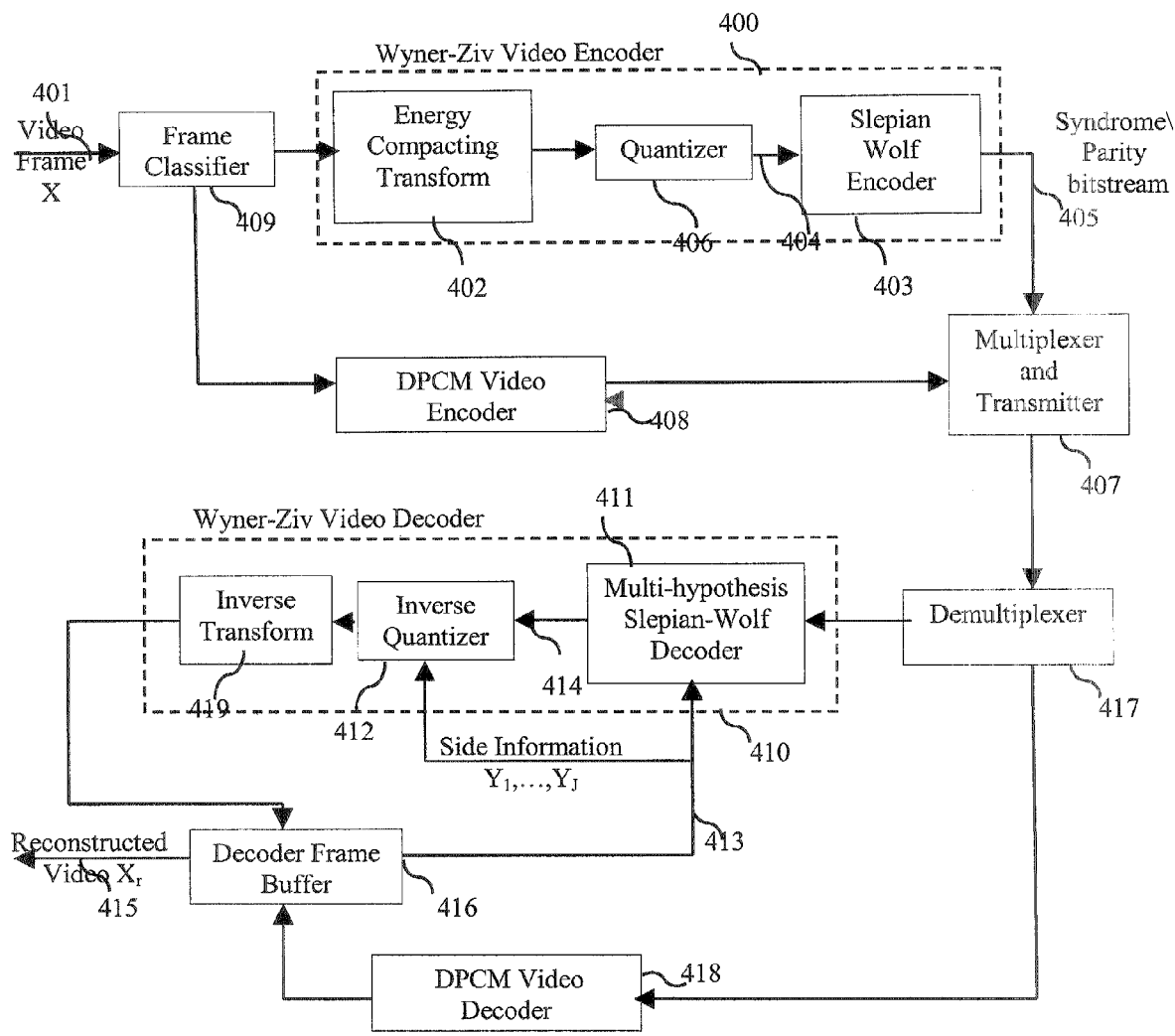
FIG. 4 is a diagram illustrating a method according to an embodiment of the present invention for Wyner-Ziv coding of a digital video sequence.

An exemplary embodiment of the present invention which relates to a system for Wyner-Ziv coding of digital video sequences is described in reference to FIG. 4, an input to the encoder is a video frame X 401, which is to be compressed and transmitted to decoder. The video frame is input to a frame classifier 409, which determines if the frame should be compressed using Wyner-Ziv coding or if it should be compressed using a differential pulse code modulation (DPCM) video encoder such as an MPEG or H.264 encoder. If the frame classifier 409 determines that the video frame 401 should be compressed using DPCM encoding, the frame is sent to a DPCM video encoder 408. The DPCM encoder means 400 uses scalar quantization followed by entropy coding to compress the frame and sends the compressed data to the multiplexer and transmitter 407.

If the frame classifier 409 determines that the video frame 401 should be compressed using Wyner-Ziv coding the frame is sent to a Wyner-Ziv video encoder 400 which comprises an energy-compacting transformer 402, a quantizer 406 and a Slepian-Wolf encoder 403. The transformer 402 applies a discrete-cosine transform (or another similar transform) to the video frame. The transform coefficients are sent to the quantizer 406. The quantizer 406 converts the real-valued transform coefficients to quantized symbols which take values in the set of integers. In an exemplary embodiment the quantizer 406 uses a uniform scalar quantizer with a deadzone to quantize the transform coefficients. The quantized coefficients 404 are sent to the Slepian-Wolf encoder 403. The Slepian-Wolf encoder 403 processes the quantized signal and generates a syndrome or parity bitstream 405, which includes a plurality of indices drawn from the set of integers or a Galois field. In an exemplary embodiment the Slepian-Wolf encoder 403 makes use of a linear block code and multiplies the parity-check matrix of the code with the quantized coefficient bitstream 404 to generate a syndrome bitstream 405. In an additional exemplary embodiment the Slepian-Wolf encoder 403 uses a systematic channel code, and the quantized signal 404 is multiplied by the generator matrix of the channel code, and the parity bits generated constitute the party bitstream 405. The generated syndrome/parity bitstream 405 is transmitted to a multiplexer and transmitter means 407, which generates the bitstream to be transmitted to the decoder.

To decode the compressed stream, a demultiplexer 417 first partitions the received stream according to the need for Wyner-Ziv decoding and DPCM decoding. The frame data which is to be decoded through the use of a DPCM video decoder is sent to the DPCM video decoder means 418, which may be the same or different video decoder as the DPCM video decoder 408. The DPCM decoder means 418 uses entropy decoding and inverse quantization to generate the reconstructed video frame which is sent to a decoder video buffer 416.

The frame data, including syndromes/parities, which is to be decoded by use of a Wyner-Ziv video decoder is sent to a multi-hypothesis Slepian-Wolf decoder 411. An exemplary embodiment of the Slepian-Wolf decoder 411 is as described above in reference to FIG. 3. The side-information $Y_1, \ldots, Y_J$ 413 for the Slepian-Wolf decoder 411 consists of a plurality of previously decoded video frames stored in the decoder frame buffer 416. The multi-hypothesis Slepian-Wolf decoder 411 makes use of the syndrome/parity bitstream and the side-information signal 413, and iterates between multiple soft channel decoders until the stopping criterion is equal to one. The decoded quantized stream 414 is sent to the inverse quantizer 412. The inverse quantizer 412 makes use of the side-information 413 and the quantized stream 414 to convert the quantized coefficients into real-valued transform coefficients. The real-valued transform coefficients are then passed through the inverse transform 419, which reconstructs the source video frame. The reconstructed frame is sent to the decoder video buffer 416 and is output as the decoded frame 415. The use of the multi-hypothesis Slepian-Wolf decoder increases the efficacy of video Wyner-Ziv decoding. This is reflected in the lower rate of the syndrome/parity bitstream transmitted from the video encoder to the video decoder. Thus the system and method allows for greater compression to be achieved in video coding. It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

Figure 5:
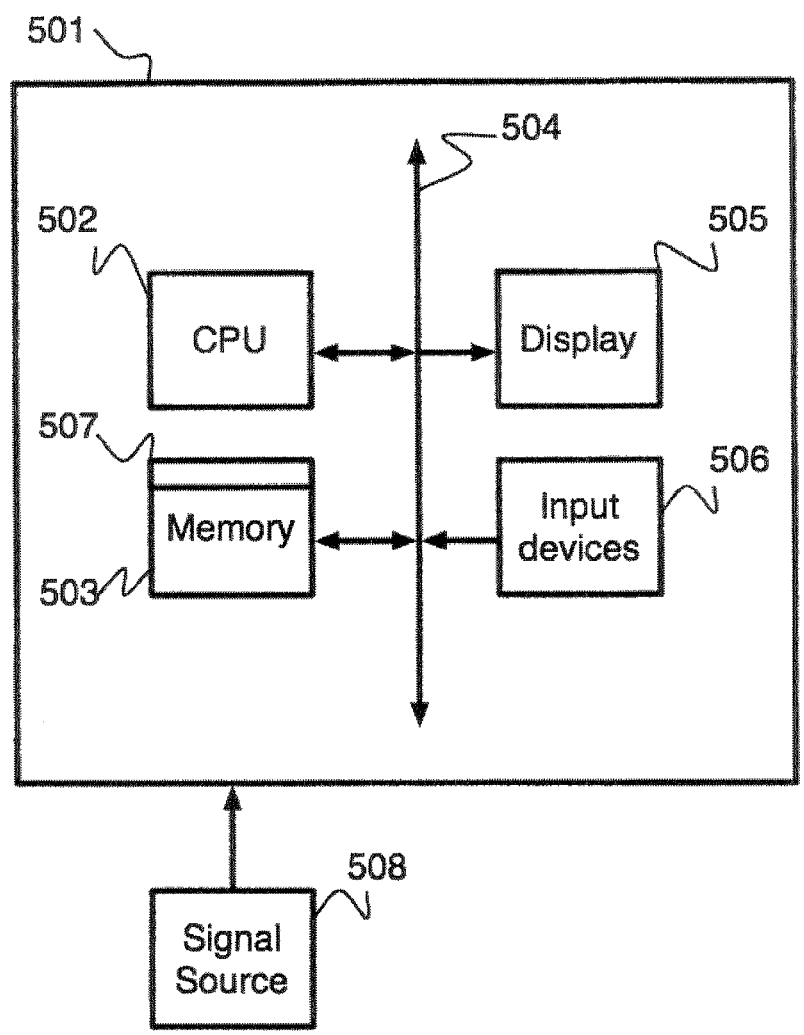
FIG. 5 is a diagram illustrating a system according to an embodiment of the present invention for implementing Wyner-Ziv decoding.

Referring to FIG. 5, according to an embodiment of the present invention, a computer system 501 for implementing Wyner-Ziv decoding in the presence of multiple decoder side-information signals using multiple soft-channel decoders for Slepian-Wolf decoding can comprise, inter alia, a central processing unit (CPU) 502, a memory 503 and an input/output (I/O) interface 504. The computer system 501 is generally coupled through the I/O interface 504 to a display 505 and various input devices 506 such as a mouse and keyboard. The support circuits can include circuits such as cache, power supplies, clock circuits, and a communications bus. The memory 503 can include random access memory (RAM), read only memory (ROM), disk drive, tape drive, etc., or a combination thereof. The present invention can be implemented as a routine 507 that is stored in memory 503 and executed by the CPU 502 to process the signal from the signal source 508. As such, the computer system 501 is a general-purpose computer system that becomes a specific purpose computer system when executing the routine 507 of the present invention.

The computer platform 501 also includes an operating system and micro instruction code. The various processes and functions described herein may either be part of the micro instruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

Having described embodiments for a mechanism and method for Wyner-Ziv decoding in the presence of multiple decoder side-information signals using multiple soft-channel decoders for Slepian-Wolf decoding, it is noted that modifications and variations can be made by persons skilled in the art in light of the above teachings. It is therefore to be understood that changes may be made in the particular embodiments of the invention disclosed which are within the scope and spirit of the disclosure.

What is claimed is:

1. A computer-implemented method for decompression in data compression systems comprising:

partitioning a plurality of decoder side-information signals into a plurality of subsets, wherein the decoder side-information signals include pre-stored and received statistical information;

determining a conditional probability function for each of the subsets of the decoder side-information signals;

estimating a plurality of a-posteriori probability functions of a source signal, each a-posteriori probability function based on a respective one of the conditional probability functions and extrinsic information;

evaluating a stopping criterion for decompression given the plurality of a-posteriori probability functions;

generating the extrinsic information based on the a-posteriori probability functions; and determining a likelihood threshold for determining a most probable value of quantized source signal based on the a-posteriori probability functions and outputting the quantized source upon determining to stop decompression, wherein the extrinsic information is generated using the following equation $$E_1(X) = \lambda_0 f(X) + \sum_{i \in \{1,\ldots,K\}, i \neq 1} \lambda_i Q_i(X),$$

wherein $E_1(X)$ is an extrinsic information function, $Q_i(X)$ is an a-posteriori probability function, $f(X)$ is a marginal probability distribution of the source signal, K is a number of a-posteriori probability functions, and λ are weights fixed or determined on the basis of $f(X)$ or $Q_i(X)$.

2. The method of claim 1, further comprising providing statistical information for determining the conditional probability functions, estimating the a-posteriori probability functions and generating the extrinsic information, including a source-side information correlation function and a marginal probability function of the source signal.

3. The method of claim 1, wherein estimating the plurality of a-posteriori probability functions comprises receiving a plurality of symbols taking values in a Galois field or a set of integers.

4. The method of claim 3, wherein estimating the plurality of a-posteriori probability functions comprises determining a maximum a-posteriori decoding on a linear block code.

5. The method of claim 3, wherein estimating the plurality of a-posteriori probability functions comprises uses graph decoding, wherein a graph is a function of a codebook of a linear block code, and graph node probabilities are determined as a function of a received signal, the extrinsic information, and the statistical information.

6. The method of claim 5, wherein estimating the plurality of a-posteriori probability functions comprises belief propagation to achieve graph decoding.

7. The method of claim 3, wherein the conditional probability function includes syndrome or parity bits of a linear block code.

8. A computer-implemented method for decompression in digital video compression systems with decoder side-information including previously reconstructed video frames, comprising:
    determining a conditional probability function for each of a plurality of subsets of side-information video frames, wherein each subset of side-information includes pre-stored and received statistical information;
    estimating a plurality of a-posteriori probability functions of a source signal, each posteriori probability function based on a respective one of the conditional probability functions and a respective extrinsic information function determined based on a previously determined a-posteriori probability for a same subset of the side-information;
    evaluating a stopping criterion for decompression given the plurality of a-posteriori probability functions;
    generating the extrinsic information based on the a-posteriori probability functions; and
    determining a likelihood threshold for determining a most probable value of a quantized source frame signal based on the a-posteriori probability functions and outputting the quantized source frame, wherein the extrinsic information is generated using the following equation $$E_l(x) = \frac{1}{\int_{i \in \{1,\ldots,K\}, i \neq l} \Pi Q_i(X) dX} \prod_{i \in \{1,\ldots,K\}, i \neq l} Q_i(X),$$

wherein $E_l(X)$ is an extrinsic information function, $Q_i(X)$ is an a-posteriori probability function, and K is a number of a-posteriori probability functions.

9. The method of claim 8, further comprising providing statistical information for determining the conditional probability functions, estimating the a-posteriori probability functions and generating the extrinsic information, including a source-side information correlation function and a marginal probability function of the source signal.

10. The method of claim 8, wherein estimating the a-posteriori probability functions comprises receiving a plurality of symbols taking values in a Galois field or a set of integers.

11. The method of claim 10, wherein estimating the a-posteriori probability functions comprises determining a maximum a-posteriori decoding on a linear block code.

12. The method of claim 10, wherein estimating the a-posteriori probability functions comprises uses graph decoding, wherein a graph is a function of a codebook of a linear block code, and graph node probabilities are determined as a function of a received signal, the extrinsic information, and the statistical information.

13. The method of claim 12, wherein estimating the a-posteriori probability functions comprises belief propagation of achieve graph decoding.

14. The method of claim 10, wherein each of the conditional probability functions includes syndrome or parity bits of a linear block code.

15. A non-transitory computer readable medium embodying instructions executed by a processor to perform a method for decompression in data compression systems with decoder side-information including a plurality of signals each of which is correlated to a source, the method comprising:
    partitioning a plurality of decoder side-information signals into a plurality of subsets, wherein the decoder side-information signals include pre-stored and received statistical information;
    determining a conditional probability function for each of the subsets of the decoder side-information signals;
    estimating a plurality of a-posteriori probability functions of a source signal, each a-posteriori probability function based on a respective one of the conditional probability functions and extrinsic information;
    evaluating a stopping criterion for decompression given the plurality of a-posteriori probability functions;
    generating the extrinsic information based on the a-posteriori probability functions; and
    determining a likelihood threshold for determining a most probable value of a quantized source signal based on the a-posteriori probability functions and outputting the quantized source upon determining to stop decompression, wherein the stopping criterion is computed using the following equation $SC = (\max\{\max_{i \in \{1,\ldots,K\}} \int (Q_i(X) - f(X))^2 dX, \max_{i,j} j \in \{1,\ldots,K\} \int (Q_i(X) - Q_j(X))^2 dX < \theta\})$, wherein SC is the stopping criterion, $Q_i(X)$ and $Q_j(X)$ are a-posteriori probability functions and f(X) is a marginal probability distribution of the source signal, and K is a number of a-posteriori probability functions.

16. The computer readable medium of claim 15, wherein evaluating the stopping criterion for decompression comprises determining a maximum integrated square error between the a-posteriori functions.

17. The computer readable medium of claim 15, wherein evaluating the stopping criterion for decompression comprises determining a true a-posteriori function by determining a mean of a subset of the a-posteriori functions which have mean square integrated error less than a fixed threshold.

18. The computer readable medium of claim 15, wherein evaluating the stopping criterion for decompression comprises passing the a-posteriori functions to an extrinsic information generator, wherein the extrinsic information generator determines the extrinsic information to send to the soft channel decoders for use in a next decoding iteration.

19. The computer readable medium of claim 17, wherein the true a-posteriori function is determined by computing the following equation $$Q(X) = \lambda_0 f(x) + \sum_{i \in \{1,\ldots,K\}} \lambda_i Q_i(X),$$

wherein Q(X) is the true a-posteriori function, f(X) is a marginal probability distribution of the source signal and $Q_i(X)$ is an a-posteriori probability function, K is a number of a-posteriori probability functions, and λ are weights fixed or determined on the basis of f(X) or $Q_i(X)$.

* * * * *